United States Patent [19]

Proud, Jr.

[11] 4,243,950
[45] Jan. 6, 1981

[54] RANDOM NOISE GENERATORS

[75] Inventor: Joseph M. Proud, Jr., Wellesley, Mass.

[73] Assignee: GTE Laboratories Incorporated, Waltham, Mass.

[21] Appl. No.: 784,032

[22] Filed: Apr. 4, 1977

[51] Int. Cl.³ .......................................... H03B 29/00
[52] U.S. Cl. ...................................... 331/78; 331/127
[58] Field of Search ............... 331/78, 127; 313/231.1, 313/231.2, 231.3, 231.4, 231.5, 231.6, 231.7, 309, 351

[56] References Cited

U.S. PATENT DOCUMENTS

| 2,427,086 | 9/1947 | Arnott et al. | 313/309 |
| 2,449,113 | 9/1948 | Fruth | 313/309 |
| 2,642,549 | 6/1953 | Pummer | 313/231.1 |
| 2,706,786 | 4/1955 | White | 331/127 |
| 2,855,514 | 10/1958 | Skolnik | 331/178 |
| 3,447,030 | 5/1969 | Gallagher et al. | 313/231.7 |
| 3,521,121 | 7/1970 | Proud, Jr. | 331/127 |

Primary Examiner—Siegfried H. Grimm
Attorney, Agent, or Firm—Fred Fisher

[57] ABSTRACT

A random noise generator for providing useful random noise power without amplification includes an anode and cathode element, disposed within a glass housing, with the electrical breakdown occurring therebetween along the inner surface of the housing is capable of generating broad band white noise.

2 Claims, 4 Drawing Figures

ONSET CONDITIONS

MODERATE FIELD

HIGH FIELD/
HIGH TEMPERATURE

RANDOM NOISE GENERATORS

The invention herein described was made in the course of or under a contract or subcontract with the U.S. Navy.

BACKGROUND OF THE INVENTION

This invention relates to random noise generators and, in particular, to a random noise generator that utilizes the partial electrical breakdown along the internal surface of a housing to generate the random noise.

The prior art is filled with devices that generate white noise. White noise may be defined as random noise voltages of a reasonably uniform amplitude throughout a wide frequency spectrum. Generally, these devices utilize the breakdown or ionization characteristics of certain gases to generate the broad band noise. However, in recent years it has been found that utilizing semiconductor devices in their reverse or breakdown mode is also capable of generating broad band white noise. Typical patents which disclose broad band noise generators are as follows:

| U.S. Pat. No. | Issue Date | Inventor |
|---|---|---|
| 2,637,003 | April 28, 1953 | Johnson, et al. |
| 2,658,149 | November 3, 1953 | Gallagher, et al. |
| 2,685,031 | July 27, 1954 | Johnson |
| 2,842,712 | July 8, 1958 | Muldoon, et al. |
| 2,855,514 | October 7, 1958 | Skolnik |
| 3,199,048 | August 3, 1965 | O'Reilly, et al. |

None of the prior art cited hereinbefore uses the surface of a glass housing for the electrical breakdown phenomena. Instead they utilize a gas or semiconductor disposed between anode and cathode elements. In the case of a semiconductor, the semiconductor is in intimate contact with the anode and cathode. Where an inert gas is used as the breakdown medium, the anode and cathode elements are spaced apart but in relatively close proximity to each other.

These sources of broad band noise find many applications in testing of receivers utilized in both commercial and military applications. These noise sources, generally, are of very low amplitude, e.g. thermal noise, which has a well established random quality. Often, the signal levels are so low that they require a high degree of amplification, which is costly and may degrade the original broad band noise characteristics of the original device.

The process of electrical breakdown may be generally divided into two types, one which is causal in nature, and one which is purely random or statistical. For example, the breakdown lag time of a gaseous spark gap may be described by a formative (causal) and a statistical (random) lag time component. In this case the initiation process occurs randomly in time, whereupon the formative process completes the breakdown. Since such breakdown usually involves relatively high voltage, high power noise signals may result. However, a disadvantage of this type of device lies in the need for the gap to recover to its original state, a factor which severely limits the repetition rate, and hence, the duty cycle.

Present observations show that partial discharges, that is, breakdown events which do not proceed fully to form a highly ionized conductive channel, develop along glass surfaces under the conditions of high electrical field stress. The high power pulses which occur are apparently the result of some cooperative process leading to aborted breakdowns which may occur at very high repetition rates (e.g. 10 MHz or more) depending upon the applied field, temperature, and light conditions.

The present invention utilizes a phenomenon heretofore not described in the prior art for the generation of random noise. Rather than relying on the ionization or breakdown of a gas or a semiconductor device, the instant invention relies on the partial discharge or breakdown events which occur along the inner surface of a rigid, electrically insulating, low leakage material such as glass, quartz or ceramic.

SUMMARY OF THE INVENTION

It is an object of the present invention to provide a high voltage level noise generator whose output consists of random noise having a substantially flat energy distribution with respect to frequency, over a wide range of frequencies.

It is another object of the present invention to utilize the partial surface breakdown of a rigid electrical insulator to generate broad band noise.

It is a further object of the present invention to generate high level broad band noise with a relatively inexpensive device.

The foregoing and other objects and advantages will be apparent from the description to follow.

A radio frequency random noise generator, according to the principles of the present invention, includes: an elongated hollow housing, the housing being a rigid, electrically insulating, low leakage material; cathode means adapted to cooperate with and seal one end of the housing, the cathode means being provided with an external terminal and an elongated portion extending into the housing, the cathode means terminal being adapted to be coupled to the negative terminal of a DC source of power; anode means adapted to cooperate with and seal the other end of the housing, the anode means being provided with an external terminal and an elongated portion extending into the housing, the anode and cathode means being spaced apart a relatively large distance; and resistance means, the resistance means having one end connected to the anode means terminal and the other end thereof adapted to be coupled to the positive terminal of the DC source of power.

In order that the invention may be more fully understood, it will now be described, by way of example, with reference to the accompanying drawing.

DESCRIPTION OF THE PREFERRED EMBODIMENTS

Figure 1:
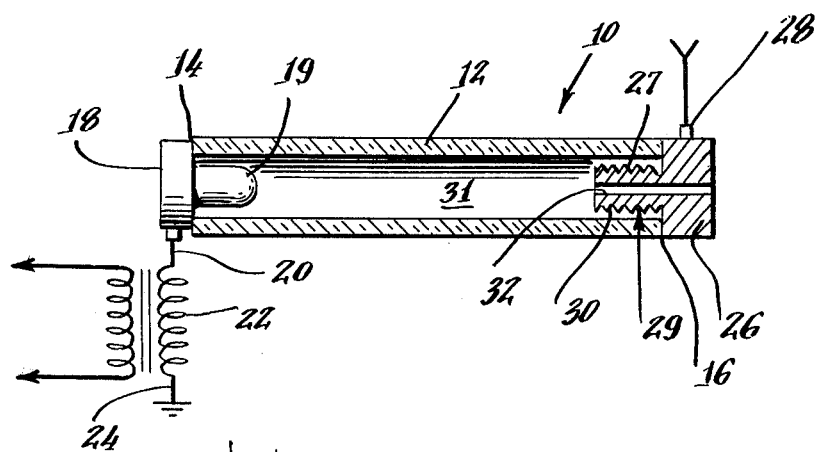
FIG. 1 is a pictorial representation in cross-section of a random noise generator, according to the principles of the present invention.

Referring now to FIG. 1, a random noise generator designated by the number 10 generally consists of a glass housing 12, preferably cylindrically shaped and open at both ends 14 and 16. The housing 12 in the preferred embodiment was fabricated from pyrex, although the phenomena to be described hereinafter were also observed with quartz and soda lime glass, as well as the aforesaid pyrex, and may be presumed to exist in varying degrees on all glass surfaces and ceramics. It appears that, although the exact phenomena is not readily understood, a rigid material having good electrical insulating qualities and low leakage characteristics, therefore, would be ideally suitable.

A metal anode 18, preferably provided with a conically shaped portion, is adapted to extend into the opening of the housing 12, and provide a seal at the edge 14 thereof. An external terminal 20 is provided on the anode 18 and is adapted to receive an electrical contact thereto.

A transformer 22 has one end thereof connected to terminal 20 of the anode 18 and its other end coupled to a ground reference terminal 24.

A cathode 26 is adapted to be inserted into end 16 of housing 12 and is provided with an elongated portion extending into the housing 12. The cathode 26 is also provided with a terminal 28 which is adapted to be coupled to the negative terminal of a source of DC power, not shown. Thus, the DC voltage, which is of a conventional type, would appear across the ground reference terminal 24 and terminal 28. The elongated portion 27 of the cathode 26 is provided with a plurality of protuberations or sharply terminated undulations 30 which increase the local electric field at the most outwardly directed edges of the extending portion of the cathode 26. Provision, not shown, allows for either a vacuum within the central portion 31 of the housing 12, or for pressurization to be supplied therein.

The gas composition inside the housing 12 is not critical as long as water vapor is not present to a high degree. Either a high vacuum or high pressure would be suitable so that the gas does not offer an alternative breakdown path, thereby restricting the electrical breakdown path to the internal surface of the housing 12.

In the preferred embodiment of the invention, the distance between the anode 18 and cathode 26 is between 3 and 5 centimeters and does not appear to be critical.

Figure 2A:
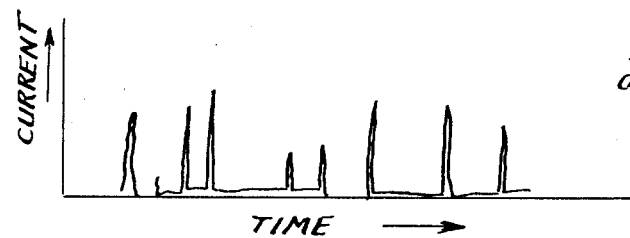
FIGS. 2A, 2B, and 2C are graphs of noise current versus time at onset, current versus time with moderate voltage applied, and current versus time with high field and high temperature conditions, respectively, of the device shown in FIG. 1.
Figure 2B:
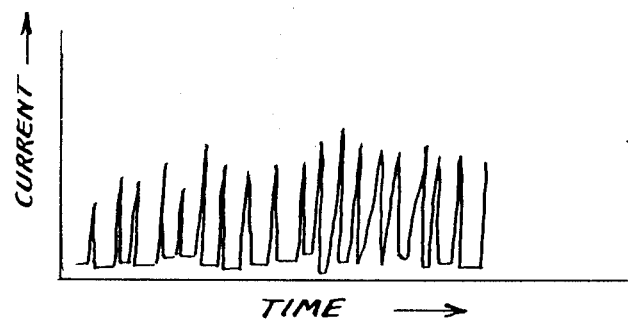
Figure 2C:
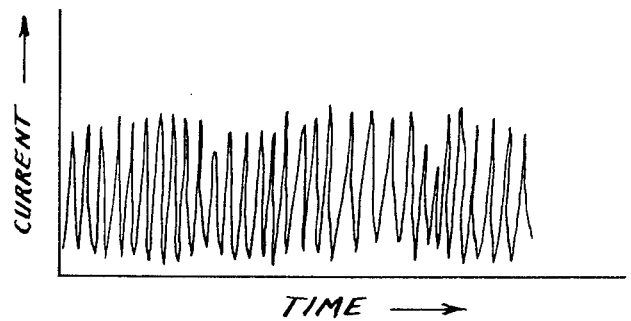

In operation, with high voltage DC applied to terminal 28, the output was observed by connecting a cathode ray oscilloscope between terminals 20 and 24. The observed current versus time graph at the onset or start condition is shown in FIG. 2A. The graph shown in FIG. 2A remains very much the same up to some threshold voltage approximating 5,000 volts. As the voltage is increased simultaneously with supplying heat to the outer surface of the housing 12, in a conventional manner not shown, a continuously increasing number of pulses are observed as shown in FIG. 2B. With increasing temperatures and voltages the output current becomes broad band white noise as shown in FIG. 2C.

The gas content of central portion 31 does not appear to be critical; however, it should be remembered that the breakdown path must be restricted to the internal surface area of the housing 12 and not through the gas or vacuum path occurring in the central area 31.

Hereinbefore has been disclosed a random noise generator which utilizes the inner surface of a hollow housing fabricated from an electrical insulating, low leakage material and relies solely on the inner surface of the housing, in lieu of the gas therein, to effectuate a partial discharge generating the random noise.

It will be understood that various changes in the details, materials, arrangement of parts and operating conditions which have been herein described and illustrated in order to explain the nature of the invention may be made by those skilled in the art within the principles and scope of the invention.

Having thus set forth the nature of the invention, what is claimed is:

1. A radio frequency random noise generator comprising:
    a. an elongated hollow housing open at both ends, said housing being a rigid, electrical insulating, low leakage material;
    b. cathode means adapted to cooperate with and seal one end of said housing, said cathode means being provided with an external terminal and an elongated portion extending into said housing, said cathode means terminal being adapted to be coupled to the negative terminal of a DC source of power;
    c. anode means adapted to cooperate with and seal the other end of said housing, said anode means being provided with external terminal and an elongated portion extending into said housing, said anode and cathode means being spaced apart at least 3 centimeters; and
    d. output means, said output means having one end connected to said anode means terminal and the other end thereof adapted to be coupled to electrical ground.

2. A random noise generator according to claim 1 wherein said housing is cylindrically-shaped.

3. A random noise generator according to claim 1 wherein said cathode elongated portion is provided with protuberations along its circumference.

4. A random noise generator according to claim 1 wherein said anode means elongated portion is generally conically-shaped.

5. A random noise generator according to claim 1 wherein said housing is glass.

6. A random noise generator according to claim 1 wherein said housing is ceramic.

7. A random noise generator according to claim 1 wherein said housing is quartz.

8. The random noise generator as recited in claim 1 wherein said anode and cathode means are spaced apart a distance which includes a range of 3 to 5 centimeters.

9. A radio frequency random noise generator comprising:
    a. elongated hollow housing means open at both ends, and having an inner surface, said housing means being a rigid, electrical insulating, low leakage material;
    b. first electrode means adapted to cooperate with and seal one end of said housing means, said first electrode means being provided with an external terminal and an elongated portion extending into said housing means, said first electrode means terminal being adapted to be coupled to one terminal of a DC source of power;
    c. second electrode means adapted to cooperate with and seal the other end of said housing means, said second electrode means being provided with an external terminal and an elongated portion extending into said housing means, said first electrode means and said second electrode means being spaced apart a relatively large distance; and d. output means, said output means having one end connected to said second electrode means terminal and the other end thereof adapted to be coupled to another terminal of said DC source of power; wherein the characteristics of the housing means and the relatively large spaced distance between the two recited electrode means are such that electrical breakdown occurs between said two electrode means along the inner surface of said housing means, such breakdown being capable of generating broad band white noise.

10. The random noise generator as recited in claim 9 wherein said housing means includes glass, and wherein the electrical breakdown phenomena occurs along the inner surface of the glass housing.

11. The random noise generator as recited in claim 9 wherein the partial discharge or breakdown occurs along the inner surface of said housing means, and wherein said rigid, electrically insulating, low leakage material is selected from the group consisting of glass, quartz and ceramic.

12. The random noise generator as recited in claim 9 wherein said first electrode means includes cathode means and said second electrode means includes anode means.

13. The random noise generator as recited in claim 12 wherein said elongated portion of said cathode means is provided with a plurality of protuberations for increasing the local electric field at the most outwardly directed edges of the extending portion of said cathode means.

14. The random noise generator as recited in claim 12 wherein said elongated portion of said cathode means is provided with a plurality of sharply terminated undulations for increasing the local electric field at the most outwardly directed edges of the extending portion of said cathode means.

15. The random noise generator as recited in claim 12 wherein the other end of said output means is coupled to electrical ground.

16. The random noise generator as recited in claim 12 wherein said cathode elongated portion is provided with protuberations along its circumference.

17. The random noise generator as recited in claim 12 wherein said anode means elongated portion is generally conically-shaped.

18. The random noise generator as recited in claim 12 wherein said housing is glass.

19. The random noise generator as recited in claim 12 wherein said housing is ceramic.

20. The random noise generator as recited in claim 12 wherein said housing is quartz.

21. A radio frequency random noise generator comprising:
a. elongated hollow housing means open at both ends, and having an inner surface, said housing means being a rigid, electrical insulating, low leakage material;
b. first electrode means adapted to cooperate with and seal one end of said housing means, said first electrode means being provided with an external terminal and an elongated portion extending into said housing means, said first electrode means terminal being adapted to be coupled to one terminal of a DC source of power;
c. second electrode means adapted to cooperate with and seal the other end of said housing means, said second electrode means being provided with an external terminal and an elongated portion extending into said housing means, said first electrode means and said second electrode means being spaced apart a relatively large distance; and
d. output means, said output means having one end connected to said second electrode means terminal and the other end thereof adapted to be coupled to another terminal of said DC source of power; wherein the characteristics of the housing means and the relatively large spaced distance between the two recited electrode means are such that the inner surface of said housing means solely effectuates a partial discharge which generates the random noise, in lieu of gas which may be encased within said housing means.

* * * * *